(12) United States Patent
Becker et al.

(10) Patent No.: US 8,488,324 B2
(45) Date of Patent: Jul. 16, 2013

(54) ELECTRIC CONTROL UNIT HAVING A HOUSING PART AND A COOLING PART

(75) Inventors: Rolf Becker, Pfullingen (DE); Christian Lammers, Stuttgart (DE); Juergen Jerg, Ofterdingen (DE); Joachim Wolff, Sonnenbuehl (DE); Volker Hochholzer, Friolzheim (DE); Ulrich Trescher, Tuebingen (DE); Helmut Bubeck, Beilstein (DE); Klaus Voigtlaender, Wangen (DE); Jan Benzler, Pliezhausen (DE); Thomas Raica, Hechingen (DE); Willi Kuehn, Markgroeningen (DE); Thomas Wiesa, Vaihingen (DE); Michael Krapp, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/452,126

(22) PCT Filed: May 13, 2008

(86) PCT No.: PCT/EP2008/055811
§ 371 (c)(1),
(2), (4) Date: Apr. 8, 2010

(87) PCT Pub. No.: WO2009/000594
PCT Pub. Date: Dec. 31, 2008

(65) Prior Publication Data
US 2010/0202110 A1   Aug. 12, 2010

(30) Foreign Application Priority Data
Jun. 28, 2007   (DE) .................... 10 2007 029 913

(51) Int. Cl.
*H05K 7/20*       (2006.01)
*F28F 7/00*       (2006.01)
*H01L 23/34*      (2006.01)
*H01L 23/26*      (2006.01)

(52) U.S. Cl.
USPC ........... 361/715; 361/704; 361/709; 361/711; 361/719; 165/80.2; 257/706; 257/712; 257/713; 174/16.3; 174/252

(58) Field of Classification Search
USPC ......... 361/704, 709, 711, 715, 719; 165/80.2; 257/706, 712–713; 174/16.3, 252
See application file for complete search history.

(56) References Cited

U.S. PATENT DOCUMENTS

| 4,628,407 A | 12/1986 | August et al. |
| 5,375,039 A * | 12/1994 | Wiesa ........................... 361/720 |

(Continued)

FOREIGN PATENT DOCUMENTS

| CN | 1376019 | 10/2002 |
| DE | 40 23 319 | 12/1991 |

(Continued)

*Primary Examiner* — Zachary M Pape
(74) *Attorney, Agent, or Firm* — Kenyon & Kenyon LLP

(57) ABSTRACT

An electrical control unit has a printed circuit board substrate, on which an electronic circuit is situated, which circuit includes multiple electrical components which are interconnected via printed conductors of the printed circuit board substrate, as well as housing parts for covering the electrical components on the printed circuit board substrate, and at least one device plug connector part situated on the printed circuit board substrate outside the section of the printed circuit board substrate covered by the housing parts. Outside the section covered by the at least one housing part and outside the section of the printed circuit board substrate provided with the device plug connector part, at least one contact point for an additional electrical component is situated on the printed circuit board substrate.

10 Claims, 4 Drawing Sheets

U.S. PATENT DOCUMENTS

| | | | | |
|---|---|---|---|---|
| 5,376,404 A | * | 12/1994 | Thams | 430/311 |
| 6,084,776 A | * | 7/2000 | Cuntz et al. | 361/707 |
| 6,530,856 B1 | | 3/2003 | Kakiage | |
| 6,724,627 B2 | * | 4/2004 | Onizuka et al. | 361/704 |
| 6,924,985 B2 | * | 8/2005 | Kawakita et al. | 361/715 |
| 2003/0117776 A1 | * | 6/2003 | Katsuro et al. | 361/705 |
| 2008/0156511 A1 | | 7/2008 | Hauer et al. | |

FOREIGN PATENT DOCUMENTS

| | | | |
|---|---|---|---|
| DE | 195 28 632 | | 2/1997 |
| DE | 101 30 833 | | 1/2002 |
| DE | 10 2005 015717 | | 10/2006 |
| DE | 10 2005 022536 | | 11/2006 |
| JP | 60-035598 | | 2/1985 |
| JP | 5-30037 | | 5/1993 |
| JP | 2001-250910 | | 9/2001 |
| JP | 2002-12097 | | 1/2002 |
| JP | 2003-198078 | | 7/2003 |
| WO | WO 2006/066983 | | 6/2006 |
| WO | WO 2006/077208 | * | 7/2006 |

* cited by examiner

ELECTRIC CONTROL UNIT HAVING A HOUSING PART AND A COOLING PART

BACKGROUND OF THE INVENTION

1. Field of the Invention

The present invention relates to an electric control unit having a printed circuit board substrate with components on both sides.

2. Description of Related Art

A control unit of this type is known from published German patent document DE 40 23 319 C1, for example, and has a printed circuit board substrate in the form of a flexible printed circuit board foil laminated onto a plate. The printed circuit board substrate is equipped on both sides with electrical components which form an electronic circuit. The components are covered by two housing parts placed on the top side and the bottom side, respectively, of the printed circuit board substrate. Outside of the area of the printed circuit board substrate covered by the housing parts, a device plug connector part is situated on the printed circuit board substrate which is connected to the components via printed conductors of the printed circuit board substrate and is used for connecting the control unit to an external cable harness. The known control unit is intended to be installed in the engine compartment of a vehicle.

Moreover, a control unit is known from published German patent document DE 195 28 632 A1 which has a printed circuit board substrate equipped with electrical components which is covered on the top side and the bottom side by housing half-shells.

The half-shells are fastened on the printed circuit board substrate using threaded fastening means. A power component situated on the printed circuit board substrate generates heat during operation which is dissipated, via through-contacts underneath the power component, to a heat-conducting layer on the bottom side of the printed circuit board substrate and from there to a housing part which is in contact with it.

In addition, an electric control unit for a transmission designed as a control module is known from published international patent document WO 2006/066983 in which a device plug connector part and a sensor are situated on a substrate whose electrical terminals are connected to a housing interior via a flexible conductor foil and are contacted there, via wire connections, with a circuit part manufactured separately.

BRIEF SUMMARY OF THE INVENTION

The electric control unit according to the present invention has the advantage over the known control units in that it is suitable to be attached to an automatic transmission by a particularly cost-effective and simple manufacturing procedure. In addition to the device plug connector part and an electronic circuit part made up of interconnected electrical components, control units which are installed in automatic transmissions must be contacted with a plurality of additional components such as actuators and/or sensors, for example. The control unit according to the present invention has advantageously only one single shared printed circuit board substrate. This may be a printed board, a flexible conductor foil on a metal substrate, or another suitable printed circuit board substrate. It is important that the printed boards of the printed circuit board substrate are not used only for the electrical connection of those electrical components which form an electronic circuit part on the printed circuit board substrate covered by housing parts, but also other printed boards which are used to connect the circuit part to a device plug connector part and to at least one contact point for an additional electrical component. This at least one contact point is situated outside of the area covered by the housing part or, if multiple housing parts are provided, outside of the area covered by the housing parts and outside of the area of the printed circuit board substrate equipped with the device plug connector part.

The at least one contact point may be advantageously electrically connected to a sensor connector part which is applied on the printed circuit board substrate. In addition, it is possible to provide at least one contact point on the printed circuit board substrate outside the area covered by the housing parts which is electrically connected to an electrohydraulic actuator, an electrically actuatable pressure control valve, for example, or a counter-contact of another transmission component.

Electrical components, such as a sensor connector part, for example, may advantageously be situated outside the area of the printed circuit board substrate covered by the housing parts and directly on the printed circuit board substrate. Other contact points on the printed circuit board substrate outside the area covered by the housing parts may be electrically connected with actuators which are situated at a spatial distance from the printed circuit board substrate.

It is particularly advantageous that the outer areas of the printed circuit board substrate which are not covered by the at least one housing part and the device plug connector part and the at least one contact point are provided with a protective coating. A plate-shaped printed circuit board substrate having a first side, a second side facing away from the first side, and a circumferential front side may advantageously include as the protective coating a coating applied to the first side and the second side and an edge cover applied to the circumferential front side. The protective coating may include a copper layer, a coat of varnish, or another suitable passivation layer which advantageously prevents diffusion of transmission fluid, water, and other harmful media into the substrate.

For improving heat dissipation, at least one housing part may be designed to have a plane surface to be placed on a cooling element provided for heat dissipation, in particular a hydraulic plate of a motor vehicle transmission.

A further improvement of heat dissipation results from the fact that at least one heat generating electrical component, situated on one first side of the printed circuit board substrate, is thermally connected via through-contacts to a heat-conducting layer on one second side of the printed circuit board substrate facing away from the first side. To further improve the heat dissipation, the heat-conducting layer is in heat-conducting contact with a housing part and/or a cooling element.

DETAILED DESCRIPTION OF THE INVENTION

Figure 1:
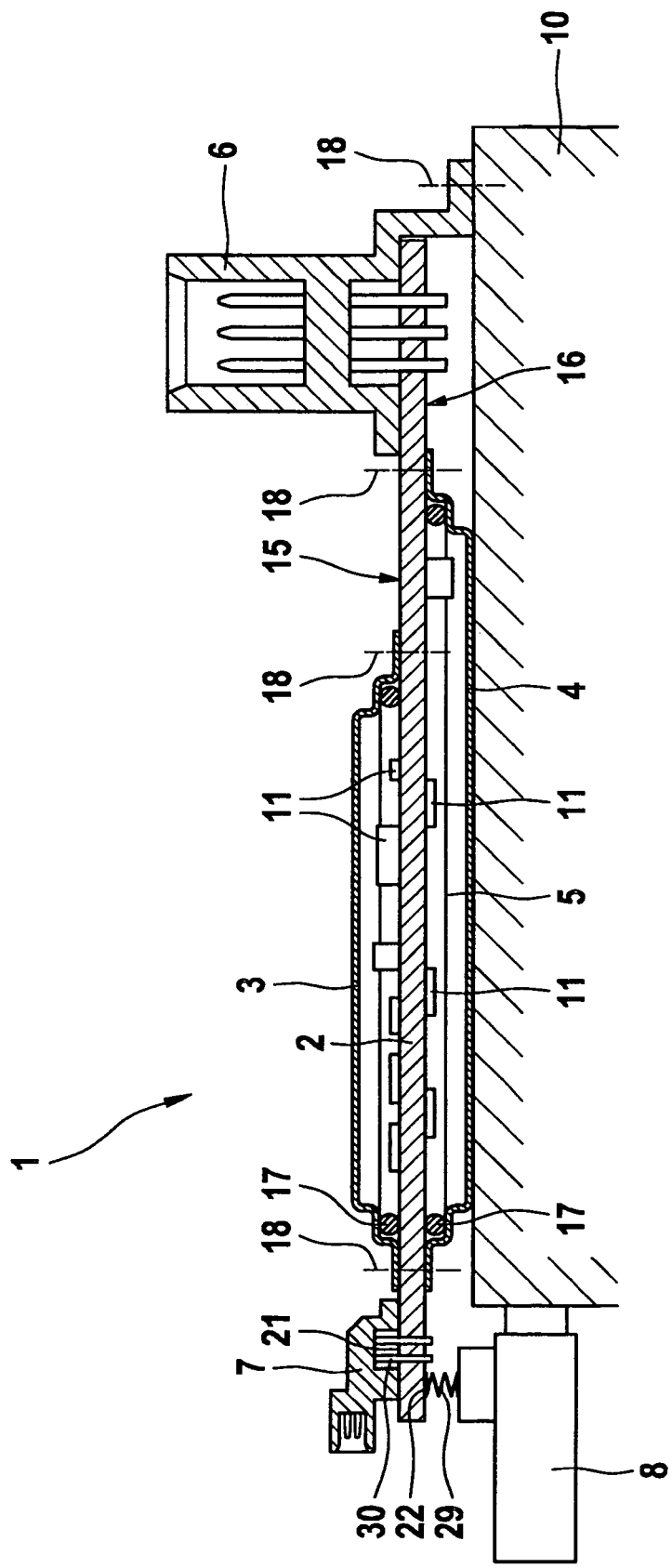
FIG. 1 shows a cross section through an electric control unit according to the present invention, having sensors and actuators situated thereon, mounted on a hydraulic plate of a transmission.

FIG. 1 shows a cross section through a first exemplary embodiment of the present invention. Electric control unit 1 according to the present invention includes a printed circuit board substrate 2, which may be designed as a single-layer printed board or a multi-layer printed board or as a flexible printed circuit board foil laminated onto a metal plate or as an injection-molded part having printed conductors embedded therein or may be designed in other ways. The printed circuit board substrate has an essentially plate-shaped design having a first side 15, a second side 16 facing away from the first side, and a circumferential front side 31. On first side 15 and second side 16, printed circuit board substrate 2 is provided in a locally limited area with electrical components 11 which form an electronic circuit 9. Of course, components 11 may also be applied only on one side of the printed circuit board substrate. The area equipped with components 11 is indicated by a dashed line in FIG. 2. Electrical components 11 are electrically connected to one another via printed conductors 12 of printed circuit board substrate 2. The printed conductors may pass through one or multiple layers of the multi-layer substrate. In addition to printed conductors 12 for wiring components 11, further printed conductors 13 and printed conductors 14 are situated on the printed circuit board substrate which lead to remote areas of printed circuit board substrate 2 outside the area occupied by electronic circuit 9 on first side 15 and second side 16. As is apparent in FIG. 2, the printed circuit board substrate has a maximum length a and a maximum width b which are dimensioned in such a way that as little material waste as possible is created. The surface area of printed circuit board substrate 2 is adapted to the conditions of a motor vehicle transmission. As is apparent in FIG. 1, components 11 belonging to electronic circuit 9 are covered on first side 15 by a housing part 3, while components 11 on second side 16 are covered by a second housing part 4. For example, housing parts 3, 4 may be designed as metallic half-shell parts, as press-bent parts, for example. As is best apparent in FIG. 3, first housing part 3 and second housing part 4 may be angled multiple times in the edge area in a known manner, so that a circumferential sealing ring 17 may be placed between the angled area of the respective housing part and printed circuit board substrate 2. Using screw connections 18 or other suitable means, first housing part 3 and second housing part 4 may be fastened to printed circuit board substrate 2, the respective circumferential sealing ring 17 being pressed together between the assigned housing part and printed circuit board substrate 2 and electronic circuit 9 being sealed to the outside.

Printed conductors 14 of printed circuit board substrate 2 connect electrical components 11 to a device plug connector part 6 which is situated outside the area on the printed circuit board substrate covered by housing parts 3, 4. Device plug connector part 6 is used to connect control unit 1 to an external cable harness. It is important that outside the area covered by housing parts 3, 4 and outside the area on printed circuit board substrate 2 covered by device plug connector part 6 at least one contact point 21 is situated which is used for contacting an additional component of the control unit. The at least one contact point 21 may be designed in the form of a metallic surface or a through-contact, for example.

Figure 2:
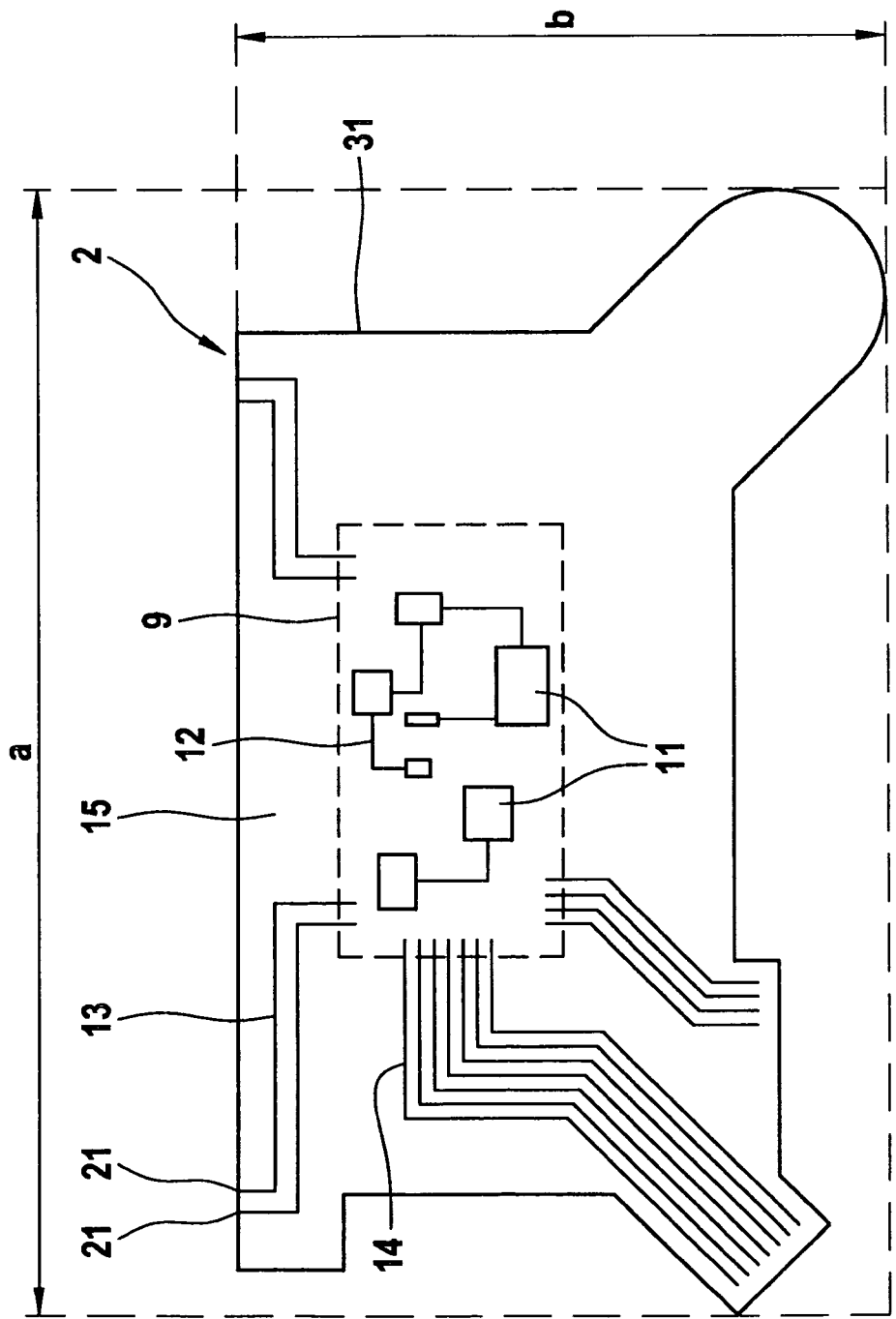
FIG. 2 shows a top view onto the printed circuit board substrate of the control unit without sensors, actuators, or housing parts.
Figure 3:
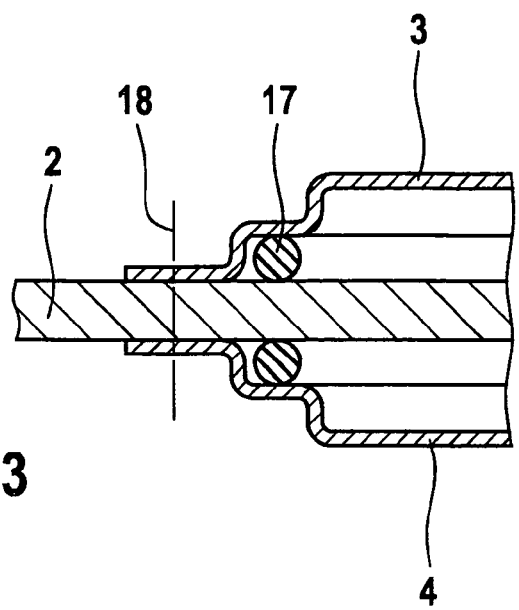
FIG. 3 shows an enlarged detail from FIG. 1.

As is shown in FIG. 1, the additional component may be a sensor connector part 7, for example. Sensor connector part 7 is used for a connection to a rotational speed sensor and is electrically connected to two contact points 21 on the printed circuit board substrate with the aid of two contact pins 30. Contact points 21 are connected to electronic circuit 9 via printed conductors 13 as it is illustrated in FIG. 2. Sensor connector part 7 may be mechanically fastened to printed circuit board substrate 2 outside the area covered by housing parts 3, 4 and the device plug connector part. As is also apparent in FIG. 1, at least one additional contact point 22 is situated on the second side of the printed circuit board substrate which is connected to an electrohydraulic actuator with the aid of an electrically conductive spring contact element 29. Electrohydraulic actuator 8 may be a pressure control valve which regulates the hydraulic pressure in a hydraulic line of the transmission. Any number of other contact points for contacting electrical components of the transmission, such as sensors, actuators, clamp contacts, and press-on contacts, for example, may be situated on printed circuit board substrate 2 outside the areas covered by housing parts 3, 4 and device plug connector part 6. The contact points may be connected to the electrical components with the aid of plug contacts, solder contacts, press-in contacts, spring contacts or other suitable means. All contact points are connected to electronic circuit 9 via printed conductors of the printed circuit board substrate.

Printed circuit board substrate 2, equipped with housing parts 3, 4, device plug connector part 6, and contact points 21, 22, and possibly electrical components 7, is mounted on a cooling element 10 via a planar outside surface of second housing part 4; the cooling element may be a hydraulic plate of a transmission, for example. Multiple actuators 8 which are electrically connected to assigned contact points 22 on the printed circuit board substrate via spring contact elements 29 are fastened to the hydraulic plate.

Figure 4:
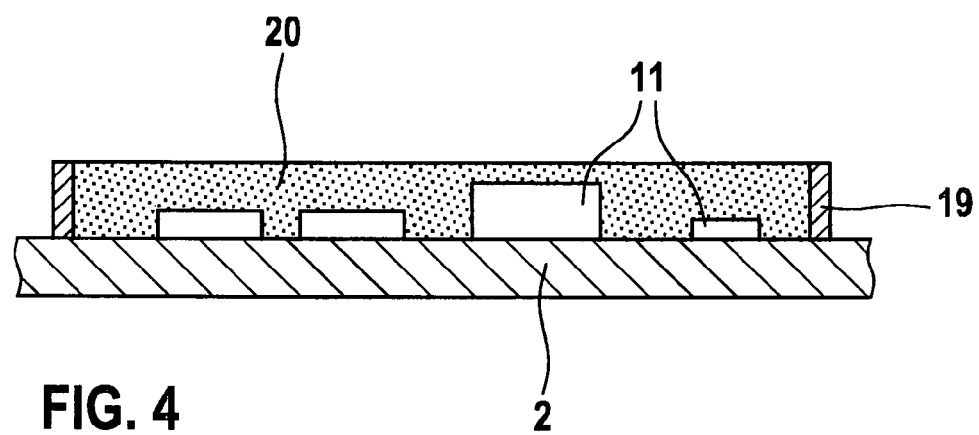
FIG. 4 shows a detail of a cross section of the printed circuit board substrate according to another exemplary embodiment of the present invention.

As depicted in FIG. 4, a frame part 19 filled with a casting compound 20 may be used as a housing part for covering electrical components 11 instead of half-shell-shaped housing part 3 or 4. But it is also possible to form the housing parts, which cover components 11, using molding compounds, foams, gels, or other means. It is important that housing parts 3, 4 protect components 11 on first side 15 and components 11 on second side 16 against aggressive media.

Figure 5:
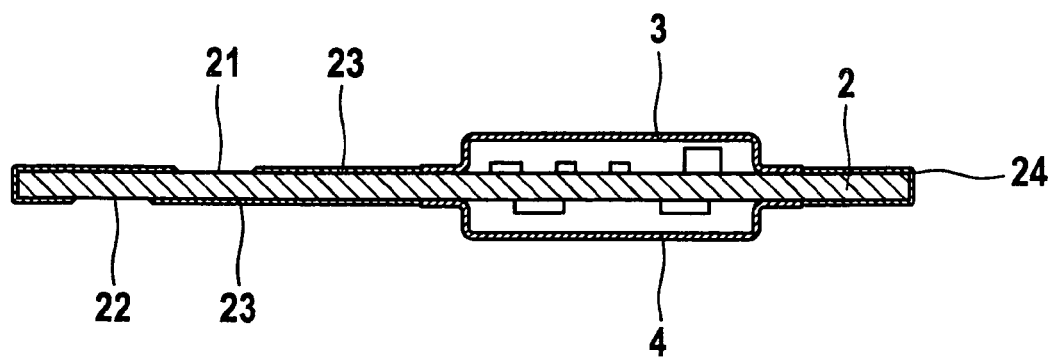
FIG. 5 shows a cross section through a further exemplary embodiment of the present invention, the device plug connector part not being depicted for the sake of simplicity.

A particularly preferred exemplary embodiment of the present invention is depicted in FIG. 5. This exemplary embodiment differs from the exemplary embodiment depicted in FIG. 1 in that the areas on first side 15 and second side 16 of printed circuit board substrate 2 not covered by housing parts 3, 4 are provided with a protective coating. For this purpose, except for the outer areas occupied by device plug connector part 6 (not depicted), housing parts 3, 4, and contact points 21, 22, first side 15 and second side 16 of printed circuit board substrate 2 facing away from the first side are each provided with a coating 23 applied over a large area. Coating 23 preferably includes a large-area copper printed circuit board, a coat of varnish, or a suitable hard or soft coating which prevents diffusion of media such as transmission fluid or moist air, for example, into the substrate. An edge cover 24 is applied to the circumferential front side of printed circuit board substrate 2 as the protective coating. Edge cover 24 may be implemented in the form of varnish, molding compounds, extrusion, or another suitable passivation.

Figure 6:
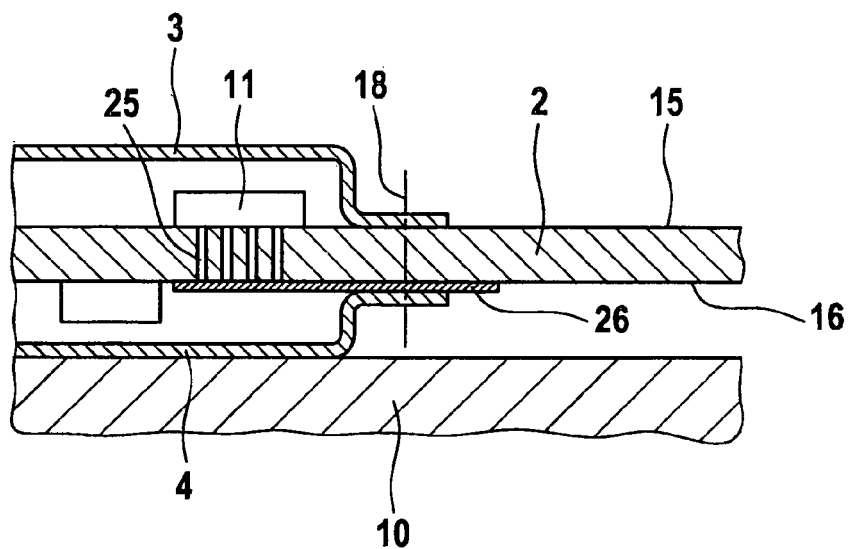
FIG. 6 shows a detail of a fourth exemplary embodiment.
Figure 7:
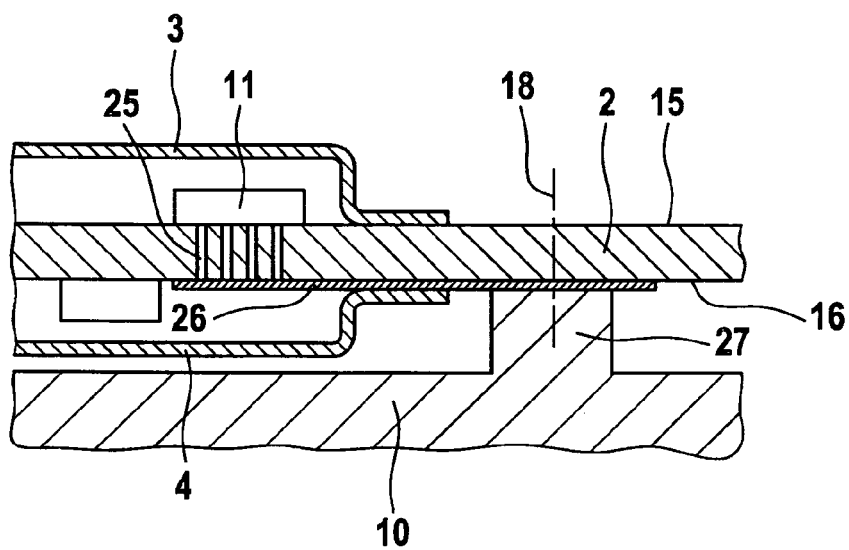
FIG. 7 shows a detail of a fifth exemplary embodiment.
Figure 8:
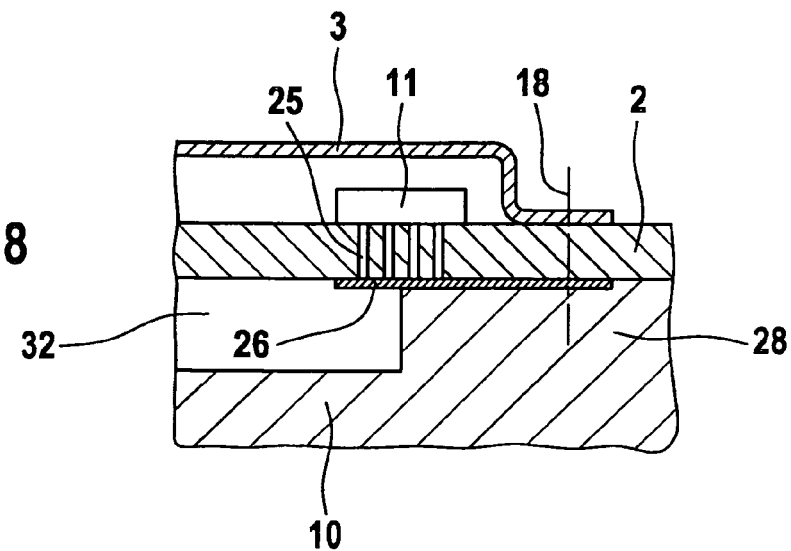
FIG. 8 shows a detail of a sixth exemplary embodiment.

Heat may be dissipated from components 11, which generate heat, in different ways. As depicted in FIG. 6, heat generated by power components 11 on first side 15 of printed circuit board substrate 2 may be dissipated to second side 16 in a manner known per se via through-contacts 25 provided in the printed circuit board substrate. Second side 16 of printed circuit board substrate 2 is in thermal contact with a heat-conducting layer 26. Heat-conducting layer 26 may be a copper layer, for example, which transfers the heat to housing part 4 which is in heat-conducting contact with the copper layer. The heat is dissipated from there to a cooling element 10, on which housing part 4 rests, and which represents a hydraulic plate of a transmission. The heat may also be transferred directly from heat-conducting layer 26 to cooling element 10. For this purpose, as depicted in FIG. 7, the cooling element may be provided with a platform 27 on which printed circuit board substrate 2 rests with heat-conducting layer 26 inserted in between. As depicted in FIG. 8, cooling element 10 may alternatively have a recess 32 and rim 28, which encloses recess 32, on which printed circuit board substrate 2 rests with heat-conducting layer 26 inserted in between.

What is claimed is:

1. An electric control unit, comprising: a printed circuit board substrate; an electronic circuit situated on the substrate, the electronic circuit including multiple electrical components interconnected by printed conductors of the printed circuit board substrate; a housing having at least one housing part covering the electrical components on the printed circuit board substrate; and at least one device plug connector part electrically connected to the electrical components; wherein the device plug connector part is situated on a section of the same printed circuit board substrate not covered by the at least one housing part, and wherein electrical connections between the electrical components and the device plug connector part are established by printed conductors of the printed circuit board substrate, and wherein at least one contact point for an additional electrical component is situated on the same printed circuit board substrate at a location outside the section covered by the at least one housing part and outside the section of the printed circuit board substrate provided with the device plug connector part, wherein the at least one contact point is electrically connected to an electrohydraulic actuator via a conductive spring contact located on a bottom side of the printed circuit board.

2. The electric control unit as recited in claim 1, wherein the additional electrical component is situated on the printed circuit board substrate.

3. The electric control unit as recited in claim 1, wherein outer areas of the printed circuit board substrate not covered by (a) the at least one housing part, (b) the device plug connector part, and (c) the at least one contact point, are provided with a protective coating.

4. The electric control unit as recited in claim 3, wherein the printed circuit board substrate has a plate-shaped configuration including a first side, a second side facing away from the first side, and a circumferential front side, and wherein the protective coating includes a coating applied to the first and second sides and an edge cover applied to the circumferential front side.

5. The electric control unit as recited in claim 3, wherein the protective coating includes one of a copper layer, a coat of varnish, or a passivation layer.

6. The electric control unit as recited in claim 1, wherein the at least one contact point is electrically connected to a sensor connector part applied to the printed circuit board substrate.

7. The electric control unit as recited in claim 1, wherein at least a portion of the housing includes a planar surface placed on a cooling element provided for heat dissipation.

8. The electric control unit as recited in claim 1, wherein at least one heat-generating electrical component situated on a first side of the printed circuit board substrate is thermally connected, via through-contacts of the printed circuit board substrate, to a heat-conducting layer on a second side of the printed circuit board substrate facing away from the first side.

9. The electric control unit as recited in claim 8, wherein the heat-conducting layer is in heat-conducting contact with at least one of a portion of the housing and a cooling element.

10. The electric control unit as recited in claim 1, wherein the control unit is a transmission control module.

\* \* \* \* \*

UNITED STATES PATENT AND TRADEMARK OFFICE
CERTIFICATE OF CORRECTION

PATENT NO. : 8,488,324 B2  Page 1 of 1
APPLICATION NO. : 12/452126
DATED : July 16, 2013
INVENTOR(S) : Becker et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 203 days.

Signed and Sealed this
Eighth Day of September, 2015

Michelle K. Lee
*Director of the United States Patent and Trademark Office*